US 6,467,073 B1

(12) United States Patent
Merchant

(10) Patent No.: US 6,467,073 B1
(45) Date of Patent: Oct. 15, 2002

(54) METHOD AND APPARATUS FOR THE AUTOMATED GENERATION OF SINGLE AND MULTISTAGE PROGRAMMABLE INTERCONNECT MATRICES WITH AUTOMATIC ROUTING TOOLS

(75) Inventor: James D. Merchant, Starkville, MS (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/451,959

(22) Filed: Nov. 30, 1999

Related U.S. Application Data

(60) Provisional application No. 60/111,692, filed on Dec. 10, 1998.

(51) Int. Cl.[7] ............................................... G06F 17/50
(52) U.S. Cl. ............................ 716/16; 716/2; 716/5; 716/17
(58) Field of Search ............................ 716/2, 5, 16, 17; 73/863.53

(56) References Cited

U.S. PATENT DOCUMENTS

| | | | | |
|---|---|---|---|---|
| 5,477,475 A | * | 12/1995 | Sample et al. | 716/17 |
| 5,659,484 A | * | 8/1997 | Bennett et al. | 716/16 |
| 6,128,770 A | * | 10/2000 | Agrawal | 716/17 |
| 6,357,305 B1 | * | 3/2002 | Witt et al. | 73/863.53 |

* cited by examiner

*Primary Examiner*—Vuthe Siek
*Assistant Examiner*—Thuan Do
(74) *Attorney, Agent, or Firm*—Christopher P. Maiorana, P.C.

(57) ABSTRACT

A method to automatically generate a single and/or multi-stage PIM, comprising the steps of (A) generating a schematic that matches a layout of the PIM, (B) optionally generating a first stage and a second stage for the PIM, depending on one or more electronic and/or physical properties of the PIM and (C) automatically placing and connecting a non-regular structure at an input and/or output of a stage of the PIM.

19 Claims, 3 Drawing Sheets

METHOD AND APPARATUS FOR THE AUTOMATED GENERATION OF SINGLE AND MULTISTAGE PROGRAMMABLE INTERCONNECT MATRICES WITH AUTOMATIC ROUTING TOOLS

This application claims the benefit of provisional application No. 60/111,692, filed Dec. 10, 1998, which is hereby incorporated by reference in its entirety.

FIELD OF THE INVENTION

The present invention relates to forming connections within programmable interconnect matrices (PIMS) and between multi-stage PIMs generally and, more particularly to a method and/or architecture for automated generation of single-stage and multi-stage PIMs, preferably using an automatic router.

BACKGROUND OF THE INVENTION

Conventional approaches to forming connections within a PIM involve automated layout creation of one or more single stage PIMs. Conventional approaches use an array tiler to place a regular array of PIM bits. The PIM bits had fixed metal patterns within them. Following placement of the connections, an architecture specific program is written to calculate contact coordinates and place contacts over the PIM bits for programming.

Referring to FIG. 1, a flow diagram of such a conventional approach 10 is shown. The approach 10 comprises a state 12, a state 14 and a state 16. The state 12 creates PIM bit cells and feedthrough cells. The state 14 uses a memory compiler to tile PIM bit cells. The state 16 runs a program to place the contacts.

Such a conventional method does not allow input to span the PIM cell boundary. Additionally, such a method is limited to only those routing channels that physically cross the cell boundary or are built into the cell (i.e., only vias are placed). Such a method also does not support placement and connection of buffers or other cells.

More leaf cells are required to handle feed through routes and varying numbers of possible inputs per PIM bit throughout the PIM array. Development of additional cells is required for feedthroughs and for varying numbers of possible inputs per PIM bit. Using conventional approaches, input connections can not span PIM cell boundaries, which reduces the number of possible inputs per PIM bit and/or increase the overall PIM bit area.

Such conventional approaches may have the disadvantages of (i) being limited to a regular array of similar structures, (ii) having limited additional structures (such as buffers) since such structures can not be inserted into distinct locations within the PIM or the PIM boundaries and be automatically connected, (iii) not handling multi-stage PIMS, (iv) not defining a schematic generation method, and (v) requiring custom contact programming code for each PIM architecture.

Complex Programmable Logic Devices (CPLDs) and other programmable logic devices (which may include simple PLDs, FPGAs and ASICs) rely on PIMs (or similar interconnect paths) to route signals within the device. Manually determining the layouts (and/or schematics) for the connections within the PIM is a time consuming process.

SUMMARY OF THE INVENTION

The present invention concerns a method to automatically generate a single and/or multistage PIM, comprising the steps of (A) generating a schematic that matches a layout of the PIM, (B) optionally generating a first stage and a second stage for the PIM, depending on one or more electronic and/or physical properties of the PIM and (C) automatically placing and connecting a non-regular structure at an input and/or output of a stage of the PIM.

The objects, features and advantages of the present invention include providing an architecture and/or method that may allow (i) placing of non-regular structures such as buffers, drivers, logic gates or other cells (e.g., structures other than conductors, contacts, switches and/or other mux elements), into a PIM, (ii) defining of logical connectivity information by a PIM application, (iii) layout pinning that may define routing channels and connection points to a next level, (iv) automatic routing of signals and placing of the contacts, (v) schematic placing arrays of PIM bits with named wire connections as defined by the PIM application and/or (iv) layout pinning and automatic routing that may hierarchically create a single stage and/or multistage layout with or without additional buffers.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 2:
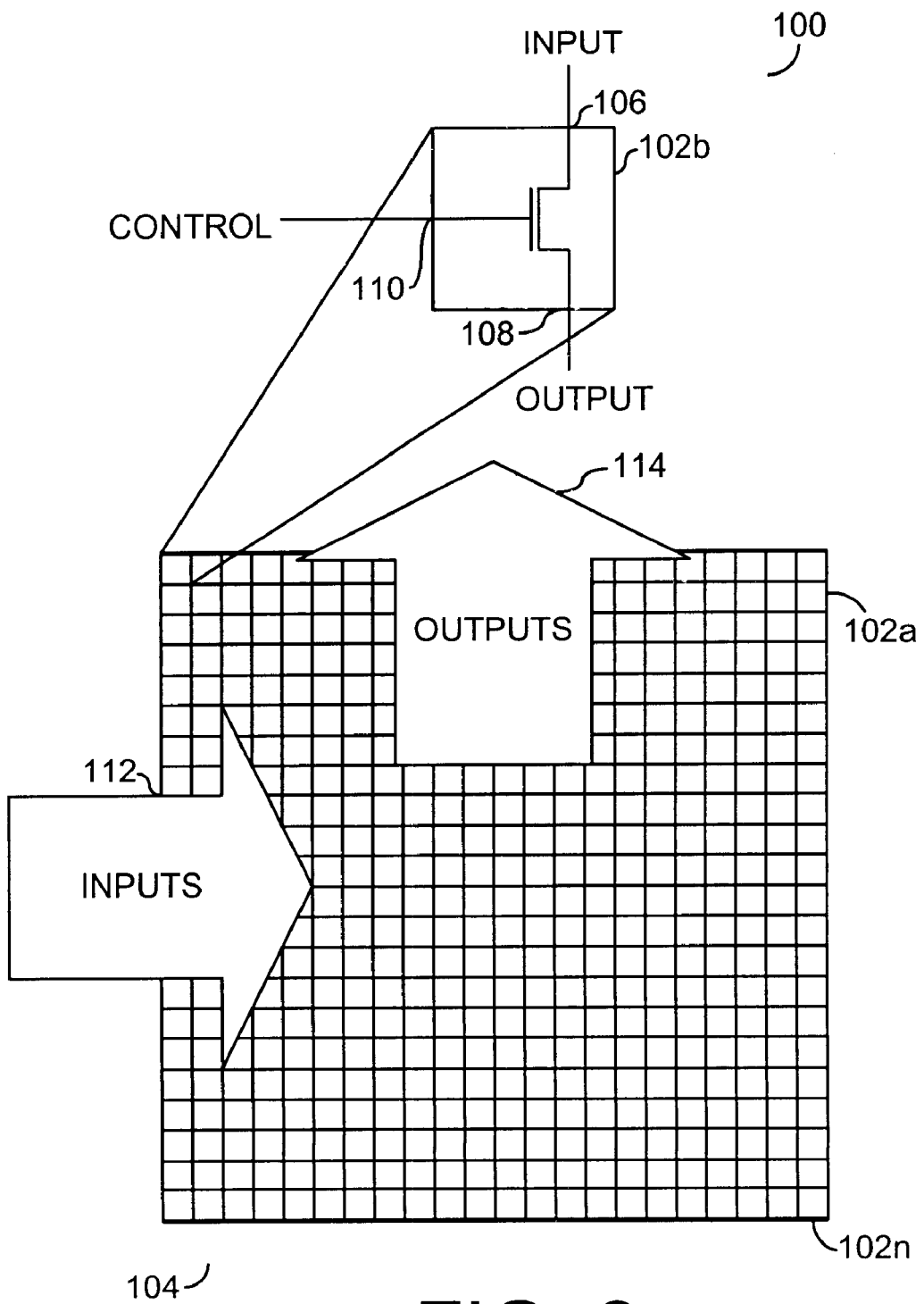
FIG. 2 is a block diagram illustrating a context of a preferred embodiment of the present invention.

Referring to FIG. 2, a block diagram of a circuit 100 is shown in accordance with a preferred embodiment of the present invention. The circuit 100 may comprise a number of multiplexers 102a–102n that may be implemented as a programmable interconnect matrix (PIM) 104. An exemplary multiplexer 102b is shown having an input 106, an output 108 and a control input 110. The PIM 104 may have an input 112 and an output 114.

The PIM 104 is generally implemented as arrays (e.g., n×m, where n and m are each >1) of single bit multiplexers 102a–102n (e.g., n×1 and/or m×1) with each multiplexer 102a–102n independently enabled by a control signal (e.g., CONTROL). An example of a single bit multiplexer 102b is shown.

The signal INPUT of a single-bit multiplexer 102 may be connected to one of many input lines depending on the design criteria of a particular implementation. Multiple single-bit multiplexer outputs 108 may be shorted having corresponding control signals CONTROL programmed to create larger multiplexers. Single-stage PIMs have only a single multiplexer 102a–102n between the input 112 and output 114 of the PIM 104. Multi-stage PIMS may have multiple multiplexers 102a–102n between the input 112 and the output 114 of the PIM 104. Buffers may need to be inserted before, between, and/or after the PIM 104 to adjust drive strengths or other parameters.

Figure 1:
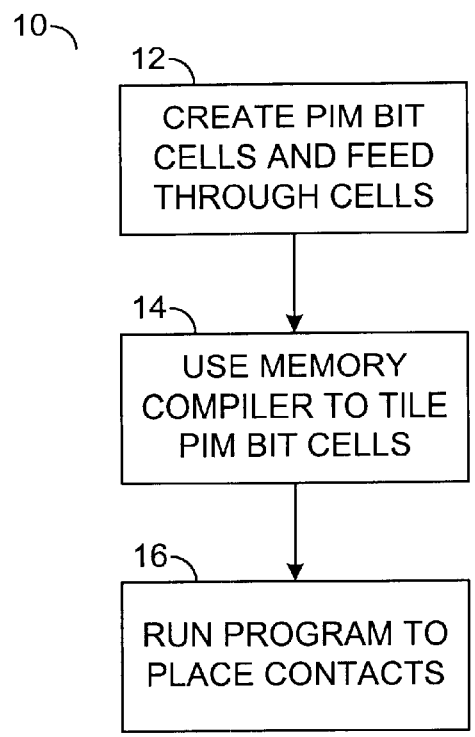
FIG. 1 is a flowchart illustrating the operation of a conventional circuit.
Figure 3:
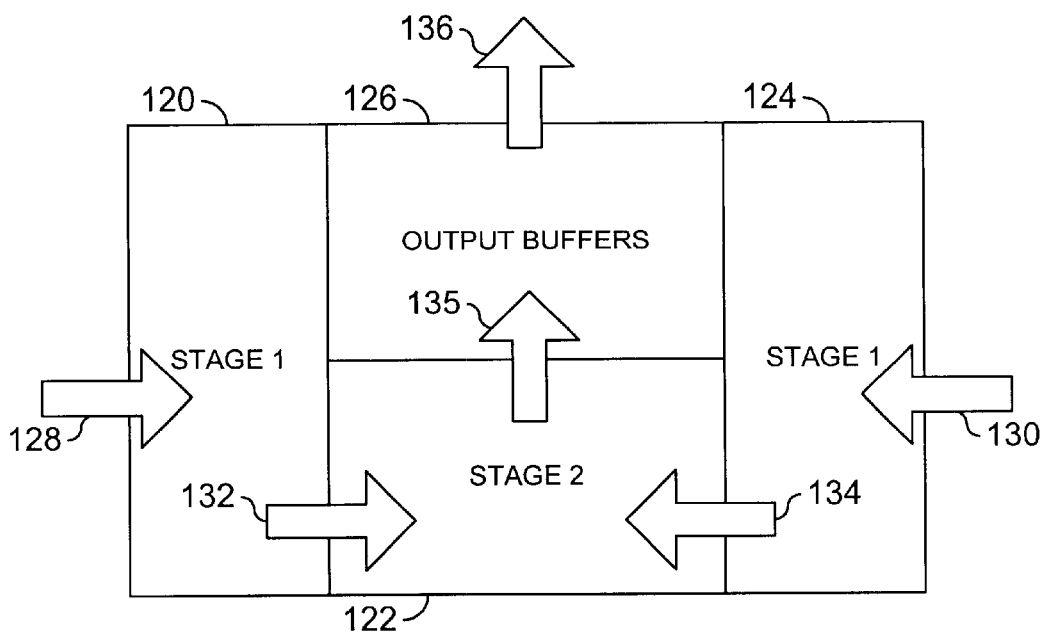
FIG. 3 is a block diagram of a preferred embodiment of the present invention.

FIG. 3 illustrates a multiple stage PIM 104. The PIM 104 comprises a stage 120, a stage 122, a stage 124 and an output buffer section 126. The stage 120 may have an input 128. Similarly, the stage 124 may have an input 130. The stage 120 may be connected to the stage 122, through a bus 132. The stage 124 may be connected to the stage 122 through a bus 134. The stage 122 may be connected to the output buffers 126 through a bus 135. The output buffers 126 may have an output 136. Generating multiple stages for the PIM 104 may depend on one or more electronic and/or physical properties of the PIM 104 being at or above (or alternatively at or below) a predetermined and/or threshold value. Such electronic and/or physical parameters may include (i) size (e.g., length, width and/or thickness), resistivity and/or capacitance of a PIM conductor, contact or switch; (ii) size of the PIM array (e.g., number of rows and/or columns, physical length and/or width, number of metal layers, etc.); (iii) maximum and/or minimum number of switches or other conductive elements (e.g., conductors, contacts, etc.) when a (routed) signal traverses through the PIM; (iv) strength (e.g., change in current and/or voltage as a function of time) of input signals into the PIM; (v) a desired strength of output signals from the PIM; and/or (vi) an aspect ratio of the PIM; etc.

Layout and schematic generation time of a PIM 104 may take weeks (or more) when generated manually. However, layout and schematic generation may be done in much less time when implemented automatically in accordance with the present invention. The present invention may eliminate the need to hand create multiple PIM bit cells and additional feed through cells. In some cases, multiple stages may reduce the number of transistors that achieve the same level of routability in a single stage PIM 104. Less transistors results in less area consumed by the PIM 104.

The following description is an exemplary procedure for automatically generating a PIM 104 in accordance with the teachings of the present invention.

Figure 4:
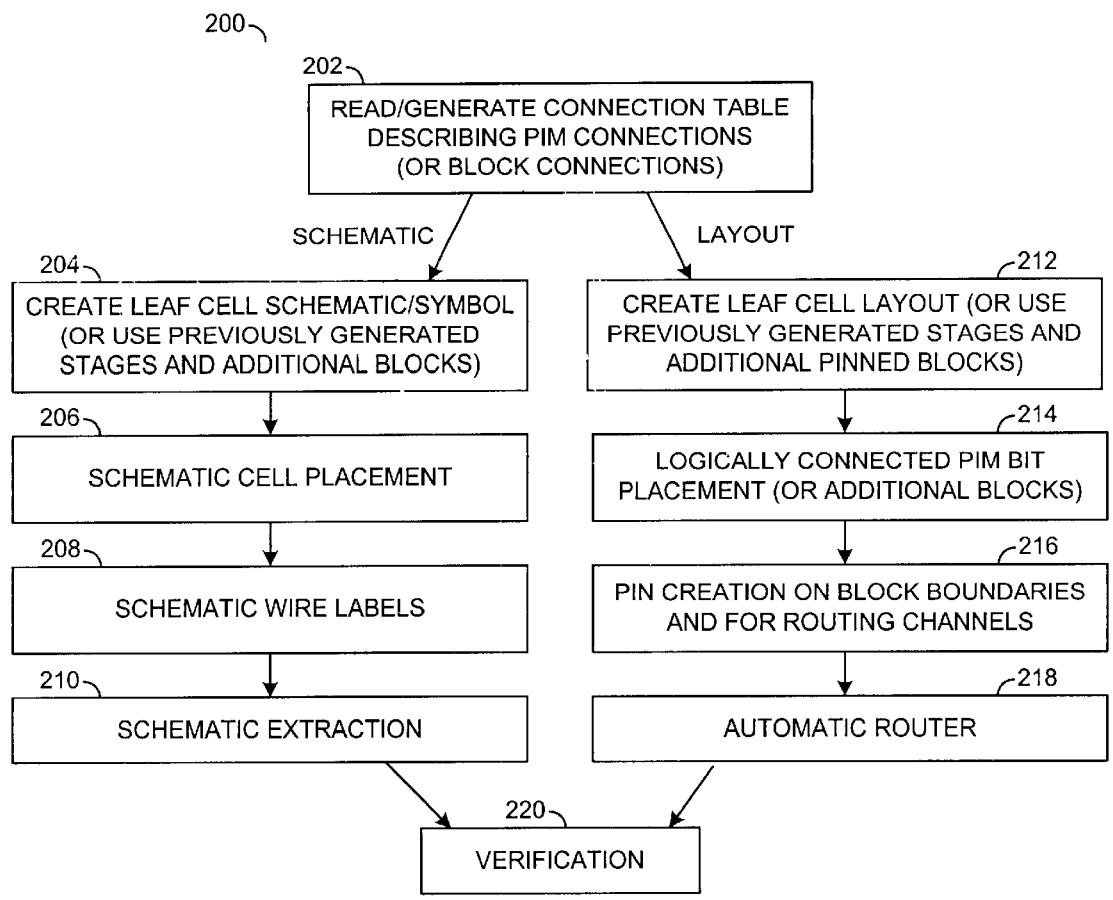
FIG. 4 is a flow chart illustrating a method of implementation of the circuit of FIG. 2 and the circuit of FIG. 3.

Referring to FIG. 4, an example of a flow diagram 200 illustrating the implementation of the present invention is shown. The flow diagram 200 generally comprises a state 202, a state 204, a state 206, a state 208, a state 210, a state 212, a state 214, a state 216, a state 218 and a state 220.

First, the state 202 generates a PIM table describing the connections between PIM bits and PIM I/Os. On the schematic side, the state 204 generates a PIM bit leaf cell schematic/symbol. In one example, the state 204 may use the previously generated stages along with additional blocks. The state 206 may create the cell placement for the schematic. The state 208 may create the wire labels for the schematic. The state 210 may extract the schematic. Logical connectivity information may be attached to each leaf cell as defined by the PIM table (e.g. an electronic file containing PIM circuit information). Additional non-PIM bit cells can also be placed in a similar manner.

On the layout side, the state 212 may create a leaf cell layout. In one example, the state 212 may use previously generated stages along with additional pinned blocks. The state 214 may logically connect the PIM bit placement. In one example, the state 214 may use additional blocks.

In the state 216, pins may be created around the boundary of the PIM array to define external PIM array connection points and internal routing channels. The state 218 may run an automatic router where the layout is then transferred routing. The router may run one pass that may be restricted (e.g., to create just the horizontal and vertical routing channels). In a subsequent (preferably the next) pass, the restrictions may be relaxed so that the inputs and outputs may be tied off to the routing channels. In the state 220, the layout is complete and ready for verification.

PIM bit symbols are automatically placed in the schematic by a placement program that ensures symbol pins do not overlap. Wire labels with the same name as the net connections defined by the PIM table are placed on the PIM bit symbols. Terminals are added to define external connections. Schematic extraction is run to add logical connectivity. The schematic is complete and ready for verification.

The Layout can be verified against the schematic by LVS (e.g., layout vs. schematic comparison software). The schematic can be verified against the PIM table by generating a PIM table from the logical connectivity information in the schematic and comparing that PIM table to the original.

A multi-stage PIM may be generated by: (i) generating each stage of the multistage PIM as defined above for a single stage PIM; (ii) generating and reading a PIM table describing connections between the PIMS; (iii) placing the PIM array layouts within the multi-stage layout with connectivity as done for the single stage PIM bits; (iv) routing the multiple stages together automatically with the router as was done for the PIM bit cells; (v) placing the PIM array symbols within the multi-stage schematic as done for the single stage PIM bits; (vi) extracting the PIM multi-stage schematic; and/or (vii) verifying the design as done for a single stage PIM.

While the invention has been particularly shown and described with reference to the preferred embodiments thereof, it will be understood by those skilled in the art that various changes in form and details may be made without departing from the spirit and scope of the invention.

What is claimed is:

1. A method to automatically generate a single and/or multistage Programmable Interconnect Matrix (PIM), comprising the steps of:
    (A) generating a schematic that matches a layout of the PIM,
    (B) optionally generating a first stage and a second stage for the PIM, depending on one or more electronic and/or physical properties of the PIM, and
    (C) automatically placing and connecting a non-regular structure at an input and/or output of a stage of the PIM, wherein said PIM comprises a multiplexer coupled between the input and the output of each stage of the PIM.

2. The method according to claim 1, wherein at least one of the steps is performed with an automatic router.

3. The method according to claim 2, wherein said automatic router is configured to route signals and place contacts.

4. The method according to claim 2, wherein said automatic router is configured to hierarchically create a single stage and or multistage layout with or without additional buffers.

5. The method according to claim 1, wherein the number of possible inputs available to a PIM bit is variable.

6. The method according to claim 1, wherein at least one electronic and/or physical property of the PIM determines that the PIM will contain multiple stages and the method comprises generating the first and second stages of the PIM.

7. The method according to claim 1, wherein said PIM comprises one or more arrays of single-bit multiplexers, wherein each multiplexer is independently enabled by a control signal.

8. The method according to claim 1, wherein said method increases a maximum number of inputs available to the PIM.

9. The method according to claim 1, wherein one of said non-regular structures comprises one or more buffers configured to adjust drive strengths.

10. The method according to claim 1, further comprising the step of:
   creating multiple PIM bit cells and/or additional feed through cells.

11. The method according to claim 1, wherein step (A) places arrays of PIM bits with named wire connections as defined by a PIM application.

12. The method according to claim 1, further comprising the step of:
   defining routing channels and connection points for layout pinning.

13. The method according to claim 1, wherein said non-regular structure is selected from group consisting of buffers, drivers, logic gates and other cells.

14. A circuit comprising:
   means for generating a schematic that matches a programmable interconnect matrix (PIM) layout;
   means for generating a single and/or multistage PIM; and
   means for automatically placing and connecting a non-regular structure at an input and/or output of a stage of the a PIM, wherein said PIM comprises a multiplexer coupled between the input and the output of each stage of the PIM.

15. The circuit according to claim 14, further comprising an automatic router configured to generate one or more of (i) said layout, (ii) said non-regular structure and (iii) said single and/or multistage PIM.

16. The circuit according to claim 14, wherein at least one electronic and/or physical property of the PIM determines that the PIM will contain multiple stages.

17. The circuit according to claim 14, wherein said circuit increases the maximum number of inputs available to the PIM.

18. The circuit according to claim 14, further comprising:
   means for creating multiple PIM bit cells and additional feed through cells.

19. A computer readable medium for storing instructions to automatically generate a single and/or multistage Programmable Interconnect Matrix (PIM), comprising the steps of:
   (A) generating a schematic that matches a layout of the PIM,
   (B) optionally generating a first stage and a second stage for the PIM, depending on one or more properties of the PIM, and
   (C) automatically placing and connecting a structure at an input and/or output of a stage of the PIM, wherein said PIM comprises a multiplexer coupled between the input and the output of each stage of the PIM.

* * * * *